(12) United States Patent
Seo et al.

(10) Patent No.: US 7,456,566 B2
(45) Date of Patent: Nov. 25, 2008

(54) TOP-EMISSION TYPE ORGANIC ELECTROLUMINESCENCE DISPLAY DEVICE AND METHOD FOR FABRICATING THE SAME

(75) Inventors: Chang-Su Seo, Suwon-si (KR); Moon-Hee Park, Busan-si (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 11/085,113

(22) Filed: Mar. 22, 2005

(65) Prior Publication Data
US 2005/0218794 A1    Oct. 6, 2005

(30) Foreign Application Priority Data
Mar. 23, 2004    (KR) .................... 10-2004-0019760

(51) Int. Cl.
*H01J 1/62* (2006.01)
*H01J 63/04* (2006.01)
*H05B 33/00* (2006.01)

(52) U.S. Cl. .................... 313/504; 313/505; 313/506; 313/498; 313/483; 428/690; 428/917

(58) Field of Classification Search .................. 313/504
See application file for complete search history.

(56) References Cited
U.S. PATENT DOCUMENTS
6,448,580 B1 * 9/2002  Arai et al. .................... 257/72

6,689,492 B1 * 2/2004  Yamazaki et al. .................... 313/506
2004/0018797 A1 * 1/2004  Murakami et al. .................... 445/24
2007/0231501 A1 * 10/2007  Finley .................... 427/531

\* cited by examiner

*Primary Examiner*—Sikha Roy
*Assistant Examiner*—Natalie K Walford
(74) *Attorney, Agent, or Firm*—H.C. Park & Associates, PLC (57) ABSTRACT

The present invention relates to a top-emission type organic electroluminescence display device, more particularly, to a top-emission type organic electroluminescence display device comprising double passivation layers of an inorganic insulation layer and an organic planarization layer formed on an upper part of a thin film transistor comprising a semiconductor layer, gate electrode and source/drain electrodes on a substrate; a reflection layer formed between the double passivation layers; and a first electrode layer formed of a transparent material and formed on a reflection layer. Furthermore, a top-emission type organic electroluminescence display device additionally comprises a reflection layer between the passivation layers and the first electrode layer to maximize reflection efficiency. Additionally, luminance between pixels is uniformed by stabilizing contact resistance between the electrodes during driving of the display device with the source/drain electrodes of the thin film transistor being directly contacted with the transparent electrode layer.

15 Claims, 7 Drawing Sheets

TOP-EMISSION TYPE ORGANIC ELECTROLUMINESCENCE DISPLAY DEVICE AND METHOD FOR FABRICATING THE SAME

CROSS REFERENCE

This application claims the benefit of Korean Patent Application No. 2004-19760, filed on Mar. 23, 2004, the disclosure of which is hereby incorporated herein by reference in its entirety.

BACKGROUND OF THE INVENTION

1. Field of the Invention

The present invention relates to a top-emission type organic electroluminescence display device formed by forming a reflection layer between double passivation layers on an upper portion of a thin film transistor, thereby directly coupling one electrode of source/drain electrodes with a transparent electrode layer that is a first electrode layer.

2. Description of Related Art

Generally, an organic electroluminescence display device in flat panel display is noticed as a next generation flat panel display in the future since it has merits of wide use temperature range, strong resistance against impact or vibration, wide viewing angle and clean motion picture due to fast response speed compared with other flat panel displays.

The organic electroluminescence display device uses a phenomenon that light is generated through a process in which the excited state is dropped to the ground state that is a stabilized state again after electrons and holes form electron-hole pairs, or carriers are excited to a higher energy state.

The organic electroluminescence display device is divided into a bottom-emission type organic electroluminescence display device in which the light generated by the phenomenon is emitted to a lower side of substrate and a top-emission type organic electroluminescence display device in which the light is emitted to an upper side of the substrate according to position of a reflection layer. Furthermore, the organic electroluminescence display device is divided into a passive matrix type organic electroluminescence display device and an active matrix type organic electroluminescence display device according to driving method of the organic electroluminescence display device, wherein the passive matrix type organic electroluminescence display device is driven in a line by line scanning method as organic light emitting devices are formed on a part where bus lines of the anode and bus lines of the cathode cross each other, and the active matrix type organic electroluminescence display device is driven by controlling on/off per each organic light emitting device as one or more of thin film transistors are formed per one organic light emitting device.

Concretely, the active matrix type organic electroluminescence display device comprises a plurality of gate lines, a plurality of data lines, a plurality of power supply lines and a plurality of pixels.

Figure 1:
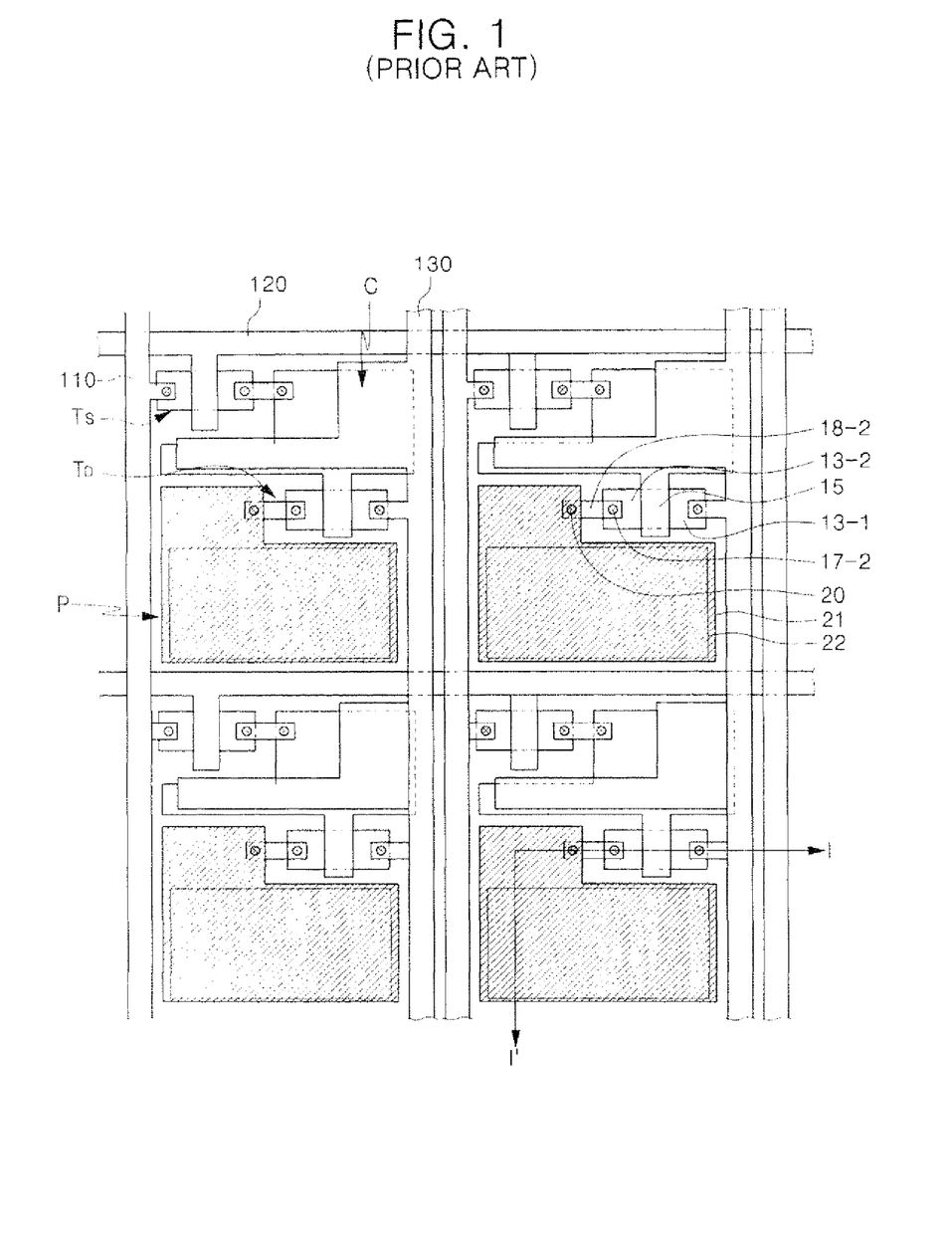
FIG. 1 is a plane figure of a top-emission type organic electroluminescence display device according to prior art.

FIG. 1 is a plane figure for showing a unit pixel of an active matrix type organic electroluminescence display device.

Referring to FIG. 1, one pixel consists of two thin film transistors and one capacitor comprising a switching thin film transistor $T_S$ coupled with a corresponding gate line 110 in a plurality of gate lines and a corresponding data line 120 in a plurality of data lines, a driving thin film transistor $T_D$ for driving organic electroluminescence devices P coupled with power supply lines 130, and a capacitor C for producing a current source of the driving thin film transistor $T_D$.

Figure 2:
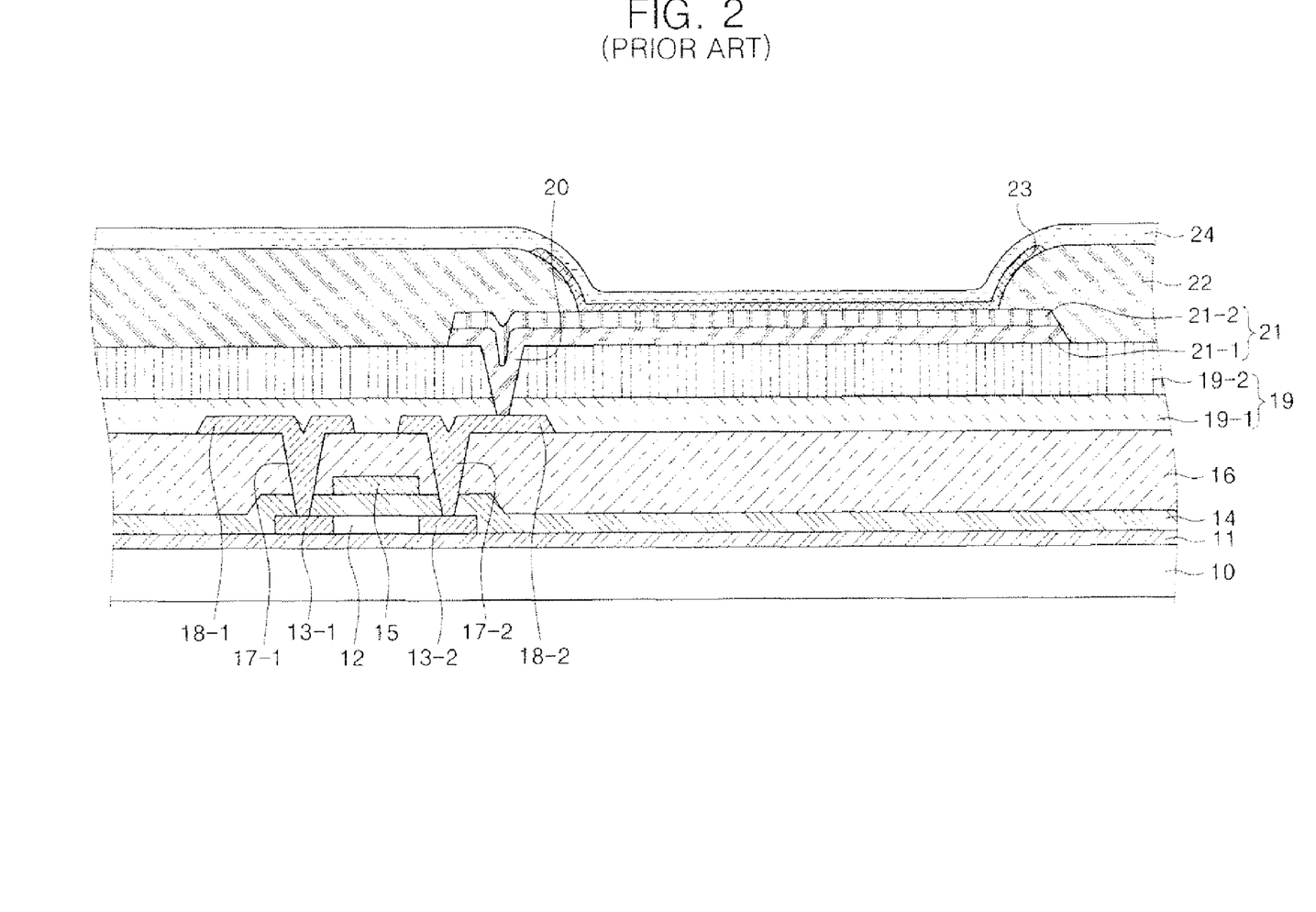
FIG. 2 is a cross sectional view taken along I-I' of FIG. 1.

FIG. 2 illustrates a cross sectional structure taken along a line I-I' of FIG. 1.

Referring to FIG. 2, a thin film transistor comprising semiconductor layer 12, gate electrode 15, source/drain regions 13-1, 13-2 and source/drain electrodes 18-1, 18-2 is formed on an insulating substrate 10 by a certain semiconductor process in an organic electroluminescence display device.

Double passivation layers 19 are formed by forming an inorganic insulating layer 19-1 for insulation and an organic planarization layer 19-2 for planarizing devices on a layer of the source/drain electrodes 18-1, 18-2 above a substrate 10 on which the thin film transistor is formed. The organic planarization layer 19-2 is formed by laying up acryl based polymer or BCB (benzocyclobutene) that is an insulating material and capable of being planarized as the organic planarization layer 19-2 on an upper part of the inorganic insulating layer 19-1 after forming the inorganic insulating layer 19-1 by laying up an inorganic insulating material such as silicon nitride (SiNx) and silicon oxide (SiOx) as an inorganic insulating layer on the substrate 10.

Next, a contact hole 20 for exposing one of the source/drain electrodes 18-1, 18-2 to the outside is formed by etching a certain part of the double passivation layers 19 consisted of the inorganic insulating layer 19-1 and the organic planarization layer 19-2.

Subsequently, a reflection electrode 21 is formed by patterning the reflection electrode material after laying up a reflection electrode material on the contact hole 20 and the double passivation layers 19 on the substrate, and a top-emission type organic electroluminescence display device is formed by organic layer 23 and second electrode layer 24 on an upper part of the reflection electrode 21.

The first electrode layer 21 is formed by adopting a reflection electrode having superior reflection characteristics, and a conductive material having reflection characteristics as well as proper work function is used as the reflection electrode. However, the first electrode layer is generally fabricated in a multilayer structure in which a reflection layer 21-1 having superior reflection efficiency is separately formed, and a transparent electrode layer 21-2 having other conductivity is formed on an upper part of the reflection layer 21-1 since a proper single material simultaneously satisfying the characteristics does not exist up to now.

As known in public, single metals including silver (Ag), aluminum (Al), chromium (Cr), molybdenum (Mo), tungsten (W), titanium (Ti) and tantalum (Ta) and alloy of the single metals are used as a material composing the reflection layer 21-1, and ITO (indium tin oxide) or IZO (indium zinc oxide) is widely used as a material composing the transparent electrode layer 21-2. Aluminum or aluminum alloy and ITO are most widely used up to now considering reflection efficiency and work function. Galvanic corrosion phenomenon is generated on an interface between dissimilar metals if a multilayer structure is adopted as a reflection electrode that is the first electrode layer 21, and a metal oxide film layer such as Al2O3 is easily formed particularly when a metal used as the reflection layer 21-1, for example, aluminum is exposed to the air. As a result of that, a contact resistance on an interface between the electrodes shows a very unstable distribution as the galvanic corrosion phenomenon between the reflection layer 21-1 and the transparent electrode layer 21-2 is diffused along the interface between the layers, and the contact resistance between the electrodes is radically increased by the formed metal oxide film layer.

According to FIG. 2, the reflection layer 21-1 is constructed in such a structure that the reflection layer 21-1 is electrically coupled with one of the source/drain electrodes 18-1, 18-2 of the thin film transistor, that is, the drain electrode 18-2. As current impressed to drive an organic electroluminescence display device is transferred to the reflection electrode 21 by passing through the contact hole 20 via the drain electrode 18-2 in the above structure, the unstable contact resistance between the reflection layer 21-1 and the transparent electrode layer 21-2 greatly lowers quality of the picture materialized by generating a luminance non-uniformity phenomenon in which some colors between pixels are brightly materialized while other colors are blackly materialized during driving of a top-emission type organic electroluminescence display device. Additionally, there are problems that luminance of pixels is lowered as the light not proceeded to the front surface of the substrate 10, but it is lost to the rear side as illustrated in FIG. 2 after a light generated in an emitting layer of the organic layer 23 is reflected from the reflection film 21-1.

SUMMARY OF THE INVENTION

Therefore, in order to solve the foregoing problems of the prior art, it is an object of the present invention to provide a top-emission type organic electroluminescence display device for improving defective characteristics in which luminance between pixels is not uniformed by unstable contact resistance on an interface between transparent electrode layer and reflection layer composing a reflection electrode, and a method for fabricating the top-emission type organic electroluminescence display device.

Furthermore, it is an other object of the present invention to provide a top-emission type organic electroluminescence display device in which reflection layer of reflection electrode is formed between double passivation layers, and a method for fabricating the top-emission type organic electroluminescence display device.

Furthermore, it is the other object of the present invention to provide a top-emission type organic electroluminescence display device in which reflection layer is additionally formed between passivation layers and first electrode layer, and a method for fabricating the top-emission type organic electroluminescence display device.

Furthermore, it is the other object of the present invention to provide a top-emission type organic electroluminescence display device in which reflection efficiency is maximized by forming reflection layer along the front surface of the passivation layers, thereby preventing light from being lost to the rear side, and a method for fabricating the top-emission type organic electroluminescence display device.

Furthermore, it is the other object of the present invention to provide a top-emission type organic electroluminescence display device in which one of source/drain electrodes of a thin film transistor is directly coupled with a first electrode layer that is a transparent electrode layer, and a method for fabricating the top-emission type organic electroluminescence display device.

Furthermore, it is the other object of the present invention to provide a top-emission type organic electroluminescence display device having uniformed luminance, and a method for fabricating the top-emission type organic electroluminescence display device.

Furthermore, it is the other object of the present invention to provide a top-emission type organic electroluminescence display device in which picture of high quality is materialized, and a method for fabricating the top-emission type organic electroluminescence display device.

In order to achieve the foregoing objects, the present invention provides an organic electroluminescence display device comprising double passivation layers formed on an upper portion of a thin film transistor comprising a semiconductor layer, gate electrode, and source/drain electrodes on a substrate; a reflection layer positioned between the double passivation layers and formed on the substrate; first electrode layer formed on the passivation layers in such a manner that the first electrode layer is electrically coupled with one of the source/drain electrodes; an organic layer comprising at least one or more emitting layers formed on the first electrode layer; and a second electrode layer formed on the substrate.

The organic electroluminescence display device further comprises a reflection layer formed between the passivation layers and the first electrode layer to increase reflection efficiency.

The source/drain electrodes comprise molybdenum (Mo) and molybdenum-tungsten alloy (MoW) ohmically contacted with transparent electrode material.

The reflection layer comprises silver (Ag), aluminum (Al), chromium (Cr), molybdenum (Mo), tungsten (W), titanium (Ti), tantalum (Ta), or alloy thereof.

The first electrode layer comprises a transparent electrode material such as ITO (indium tin oxide) and IZO (indium zinc oxide).

First passivation layer in the double passivation layers is an inorganic insulation layer while second passivation layer in the double passivation layers is an organic planarization layer, and vise versa.

Furthermore, the present invention provides a method for fabricating an organic electroluminescence display device comprising the steps of forming a thin film transistor equipped with a semiconductor layer, gate electrode, and source/drain electrodes on a substrate in a non-emitting region; forming a first passivation layer comprising the source/drain electrodes on the substrate; forming a reflection layer on the first passivation layer on the substrate; forming contact holes for exposing one of the source/drain electrodes to the outside by etching a selected region of the reflection layer; forming a second passivation layer on the reflection layer on the substrate; exposing one of the source/drain electrodes to the outside by etching a selected region of the second passivation layer so that the second passivation layer is coupled with the contact holes; forming a first electrode layer coupled with one of the source/drain electrodes by patterning the transparent electrode material after depositing a transparent electrode material on the substrate; forming an organic layer comprising at least one or more of emitting layers on the first electrode layer; and forming an organic electroluminescence device by forming a second electrode layer on the substrate.

The method further comprises a step of forming a reflection layer between the step of forming contact holes of second passivation layer and the step of forming first electrode layer.

The reflection layer positioned between the passivation layers and the first electrode layer is formed in such a manner that the reflection layer is coupled with the source/drain electrodes by patterning the reflection electrode material after depositing a reflection electrode material over the front surface of a substrate.

BRIEF DESCRIPTION OF THE DRAWINGS

The above and other features and advantages of the present invention will become more apparent to those of ordinary skill in the art by describing in detail preferred embodiments thereof with reference to the attached drawings in which.

(Explanation of Marks for Principal Parts of Drawings)

10, 50a, 50b: insulation substrate 11, 51a, 51b: buffer layer 12, 52a, 52b: semiconductor layer 13-1, 13-2, 53-1a, 53-2a, 53-1b, 53-2b: source/drain regions 14, 54a, 54b: gate insulation layer 15, 55a, 55b: gate electrode 16, 56a, 56b: interlayer insulation layer 17-1, 17-2, 57-1a, 57-2a, 57-1b, 57-2b: contact hole/via hole 18-1, 18-2, 58-1a, 58-2a, 58-1b, 58-2b: source/drain electrodes 19-1, 59a, 59b: first passivation layer 19-2, 61a, 61b: second passivation layer 20, 62a, 62b: contact hole 21-1, 60a, 60-1b, 60-2b: reflection layer 21-2, 63a, 63b: transparent electrode layer 22, 64a, 64b: planarization insulation layer 23, 65a, 65b: organic layer 24, 66a, 66b: second electrode layer 110, 210: data line 120, 220: gate line 130, 230: power supply line

DETAILED DESCRIPTION OF THE INVENTION

The present invention will now be described in detail in connection with preferred embodiments with reference to the accompanying drawings. For reference, like reference characters designate corresponding parts throughout several views.

Figure 3:
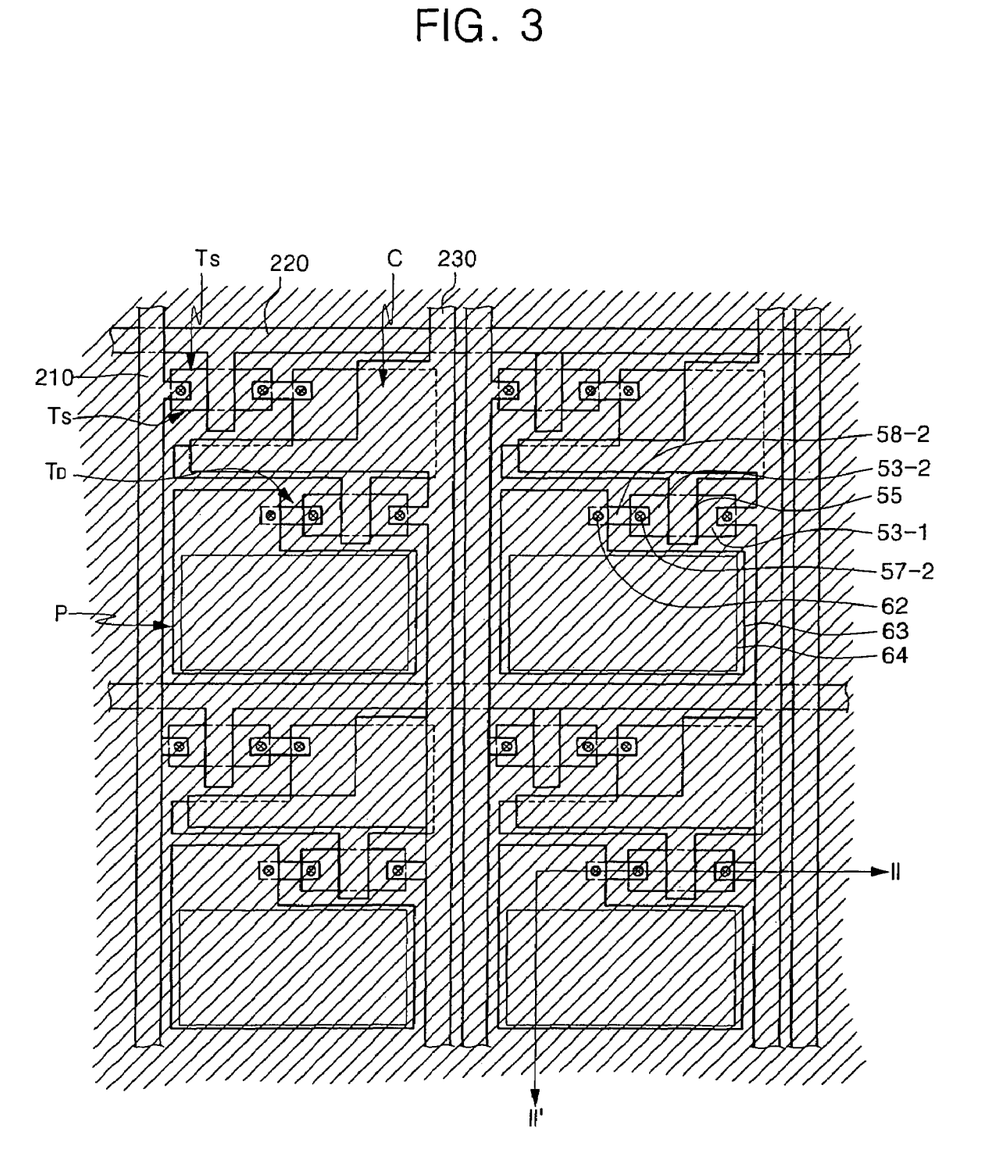
FIG. 3 is a plane figure of a top-emission type organic electroluminescence display device according to the present invention.

FIG. 3 is a plane figure for approximately illustrating one pixel of an organic electroluminescence display device according to the present invention.

Referring to FIG. 3, one pixel part is defined by crossing signal lines arranged on an insulation substrate in a matrix shape each other, and a thin film transistor is positioned at a crossing point at which two wires cross. The signal lines comprise data lines 220 for impressing data voltage, power supply lines 230 which are formed in such a way that the power supply lines are parallel to the data lines with being adjacent to the respective data lines, and to which a power supply is always impressed while an organic electroluminescence devices P are being driven, and gate lines 210 which are crossed perpendicularly to the data lines 220 and the power supply lines 230 to impress on/off signals of the thin film transistor to the data lines 220 and the power supply lines 230.

Switching thin film transistors $T_S$, driving thin film transistors $T_D$, storage parts C and organic electroluminescence devices P are installed in pixels formed on crossing regions of the data lines 220, the power supply lines 230 and the gate lines 210.

As illustrated in FIG. 3, the switching thin film transistors $T_S$ in the two thin film transistors is a part which is formed adjacently to the gate lines 210 and filled in the storage part C so that the organic electroluminescence devices P maintain their images during one frame, wherein the switching thin film transistors $T_S$ largely comprises a gate electrode for impressing TFT on/off signals to the gate lines with being coupled with the gate lines 210, a source electrode formed on an upper part of the gate electrode and coupled with the data lines 220 to supply data signal to the data lines, and a drain electrode electrically coupled with the switching thin film transistors $T_S$ and the storage parts C to supply power supply to the storage part C.

The storage part C is formed in a certain space between the switching thin film transistor $T_S$ and the driving thin film transistors $T_D$ to store a driving voltage required for driving the driving thin film transistors $T_D$ during one frame.

Furthermore, the driving thin film transistors $T_D$ is a part that is formed on a lower part of the storage part C and supplies current for driving an organic electroluminescence device P, wherein the driving thin film transistors $T_S$ largely comprises a gate electrode coupled with a lower electrode of the storage part C to supply on/off signals of thin film transistor to the lower electrode of the storage part, a source electrode formed on an upper part of the gate electrode and coupled with the power supply line 230 to supply data signals to the power supply line, and a drain electrode for impressing a driving power supply to the organic electroluminescence device P by electrically coupled with the driving thin film transistors $T_D$ and the organic electroluminescence device P.

On the other hand, the organic electroluminescence device P is a part formed on a residual region except a region on which the switching thin film transistors $T_S$, driving thin film transistors $T_D$ and storage parts C are formed in a pixel so that the organic electroluminescence device P itself emits red, green and blue lights by flow of current to display a certain image of information. The organic electroluminescence device P comprises first electrode layer (or pixel electrode) electrically coupled with the driving thin film transistors $T_D$, second electrode layer which covers a pixel on the first electrode layer, and to a which power supply is supplied, and an emitting layer formed between the first and second electrode layers to emit certain colors by flow of current.

Figure 4:
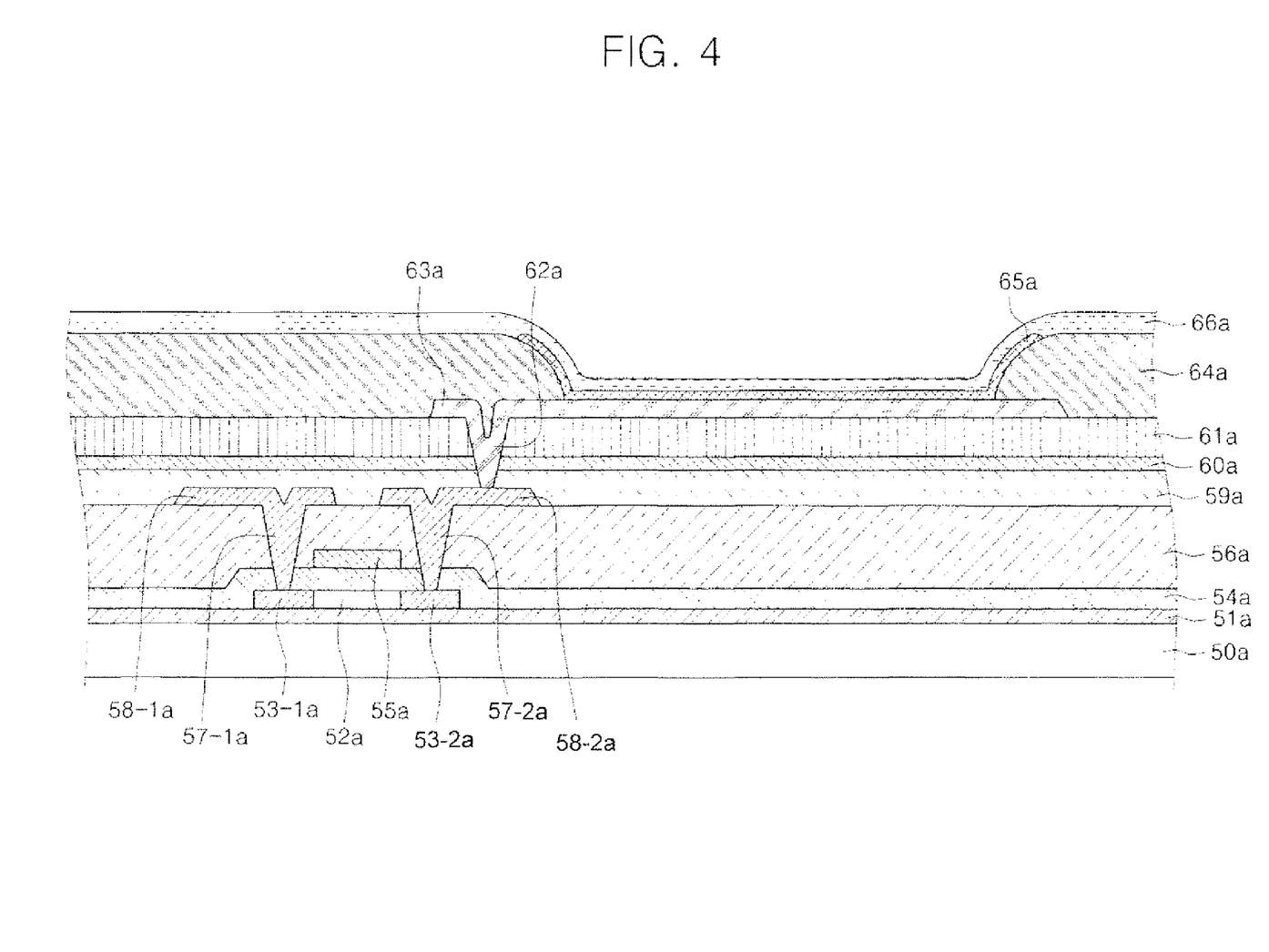
FIG. 4 is a cross sectional view of an organic electroluminescence display device taken along II-II' of FIG. 3 according to first preferred embodiment of the present invention.

FIG. 4 is a cross sectional view of a top-emission type organic electroluminescence display device comprising driving thin film transistors $T_D$ and organic electroluminescence devices P that is taken along line II-II' of FIG. 3 according to first preferred embodiment of the present invention. A method for fabricating an organic electroluminescence display device including thin film transistors is described as follows.

Referring to FIG. 4, an insulation substrate 50a such as glass substrate or synthetic resin is first prepared. Then, a buffer layer (diffusion barrier) 51a is deposited on the insulation substrate 50a by PECVD (plasma enhanced chemical vapor deposition), LPCVD (low pressure chemical vapor deposition), sputtering, etc. to prevent the impurities from penetrating activation layer (polycrystalline silicon) as impurities such as metal ions are being diffused from the insulation substrate 50a.

Next, a polycrystalline silicon film is formed on the amorphous silicon film through the crystallization process after depositing an amorphous silicon film on the buffer layer 51a along the front surface of the substrate 50a by PECVD, LPCVD, sputtering, etc., wherein crystallization processes including ELA, MIC, MILC, SLS and SPC are used as the crystallization process. Subsequently, a photoresist is formed on the polycrystalline silicon film to pattern the polycrystalline silicon film, and an island shaped semiconductor layer (active layer) 52a is formed through an ordinary etching process using photoresist patterns obtained by patterning the coated photoresist after coating the photoresist on the polycrystalline silicon film.

Continuously, a gate insulation layer 54a consisted of an oxide film is formed on the semiconductor layer 52a along the front surface of the substrate by a method such as thermal oxidation.

Then, an island shaped gate electrode 55a is formed on the gate insulation layer 54a formed on an upper part of the semiconductor layer 52a by patterning the gate metallic substance after depositing a gate metallic substance on the gate insulation layer 54a.

Subsequently, high concentration source/drain regions 53-1a, 53-2a are formed on the semiconductor layer 52a corresponding to both sides of the gate electrode 55a by ion implanting n type or p type impurities into the semiconductor layer 52a, wherein a LDD (lightly-doped-drain) region doped with low concentration impurities can be further formed between the high concentration source/drain regions 53-1a, 53-2a and the semiconductor layer 52a to reduce off current generated during driving of a display device.

Next, contact hole/via hole 57-1a, 57-2a for exposing the high concentration source/drain regions 53-1a, 53-2a to the outside is formed by etching a selected region after forming an interlayer insulation layer 56a the gate insulation layer 54a including the gate electrode 55a along the front surface of the substrate 50a.

Continuously, source/drain electrodes 58-1a, 58-2a are formed by patterning the metallic substance after depositing a metallic substance on the contact hole/via hole 57-1a, 57-2a along the front surface of the substrate 50a, wherein the source/drain electrodes 58-1a, 58-2a are electrically coupled with the source/drain regions 53-1a, 53-2a of lower semiconductor layer 52a through the contact hole/via hole 57-1a, 57-2a. The source/drain electrodes 58-1a, 58-2a are formed of molybdenum (Mo) or molybdenum-tungsten alloy (MoW), preferably formed of molybdenum-tungsten alloy (MoW) that is ohmically coupled with the transparent electrode considering electrical characteristics with a transparent electrode formed in the succeeding process.

Next, first passivation layer 59a is formed on the source/drain electrodes 58-1a, 58-2a along the front surface of the substrate 50a. First and second double passivation layers 59a, 61a are adopted in the present invention, wherein the second passivation layer 61a is an organic planarization layer if the first passivation layer 59a is an inorganic insulation layer, and vice versa. For convenience' sake, an inorganic insulation layer is formed as the first passivation layer 59a, and an organic planarization layer is formed as the second passivation layer 61a in the preferred embodiment of the present invention. As the first passivation layer 59a, silicon nitride (SiNx) or silicon oxide (SiOx) is deposited on the front surface of the substrate.

Particularly, a reflection layer 60a is formed between the double passivation layers 59a, 61a to realize a top-emission type organic electroluminescence display device in the present invention. The reflection layer 60a is formed by depositing a metallic substance selected from the group consisting of silver (Ag), aluminum (Al), chromium (Cr), molybdenum (Mo), tungsten (W), titanium (Ti), tantalum (Ta) and aluminum-neodymium (Al—Nd) alloy on an upper part of the first passivation layer 59a along the front surface of the substrate using RF sputtering, DC sputtering, ion beam sputtering or vacuum deposition.

The reflection layer 60a is formed on a non-emission region such as thin film transistor region along the front surface of the substrate 50a without performing a separate patterning so that reflection efficiency is increased by reflecting light lost to the rear side of a conventional substrate 50a to the front surface of the substrate as illustrated in FIG. 4. When comparing FIG. 1 showing a plane figure of display device according to prior art with FIG. 3 showing a plane figure of display device according to the present invention, in which an oblique line part shows a formation range of the reflection layer 60a, it could be seen that a reflection layer 60a was formed on an emission region of a display device according to the prior art while a reflection layer 60a was formed on the whole pixel region including a non-emission region of a display device according to the present invention. Furthermore, it could be confirmed referring to FIG. 7a and FIG. 7b that luminance between pixels was uniformed, and reflection efficiency was increased in a top-emission type organic electroluminescence display device obtained in experimental example according to the present invention compared with a top-emission type organic electroluminescence display device obtained in comparative example according to prior art.

The reflection layer 60a can be formed in a flat plate shape or bent shape according to materials composing the first passivation layer 59a and the second passivation layer 61a.

Concretely, metal patterns such as data lines 120, power supply lines 130 and storage electrode (not illustrated on drawing) are simultaneously formed on an interlayer insulation layer 56a although they are not illustrated in a step of forming the source/drain electrodes 58-1a, 58-2a. The reflection layer 60a formed by a deposition method such as sputtering the succeeding process has the same shape as the first passivation layer since the inorganic insulation material is deposited is formed in a bent shape with being deposited to an equal thickness along the metal patterns in case of depositing an inorganic insulation material as the first passivation layer 59a. Due to the bent shape of the reflection layer 60a, a display device according to the present invention has merits that reflection efficiency is increased, luminance of pixels is increased, and power consumption is reduced accordingly by reflecting the focused light after focusing an EL light in a perpendicular direction or inclined direction projected from emitting layer of an organic layer 60a to one point.

On the contrary, if an organic planarization layer is used as the first passivation layer 59a, a flat layer is formed irrespective of shape of the metal patterns under the first passivation layer so that the reflection layer 60a formed on an upper part of the first passivation layer is also formed in a flat plate shape.

Continuously, contact holes (not illustrated on drawing) for exposing the source/drain electrodes formed under the reflection layer 60a to the outside are formed by etching a selected region after forming photosensitive patterns on an upper part of the reflection layer 60a. As a result of that, the reflection layer 60a of a contact hole region is not coupled with the source/drain electrodes 58-1a, 58-2a formed under the reflection layer 60a as illustrated in FIG. 4.

Next, second passivation layer 61a is formed on the reflection layer 60a along the front surface of the substrate 50a, wherein an organic planarization film using an organic insulation material is formed as the second passivation layer 61a in preferred embodiment of the present invention. The organic insulation material is selected from the group consisting of polyacrylates resin, epoxy resin, phenolic resin, polyamides resin, polyimides resin, unsaturated polyesters resin, poly(phenyleneethers) resin, poly(phenylenesulfides) resin and benzocyclobutene (BCB).

Subsequently, one of the source/drain electrodes 58-1a, 58-2a is exposed to the outside by etching a selected region of the second passivation layer 61a, thereby forming a contact hole 62a coupled with a contact hole (not illustrated on drawing) formed in the preceding process.

Particularly, the source/drain electrodes 58-1a, 58-2a are electrically coupled with first electrode layer 63a that is a transparent electrode layer through the contact hole 62a in the present invention. Subsequently to the previous process, the first electrode layer 63a is formed by patterning the deposited transparent electrode material after depositing a transparent electrode material such as ITO (indium tin oxide) and IZO (indium zinc oxide) on the contact hole 62a along the front surface of the substrate 50a using sputtering or vacuum deposition method.

Referring to FIG. 4, consequently, the first electrode layer 63a is electrically coupled with one of the source/drain electrodes 58-1a, 58-2a under the first electrode layer 63a through the contact hole 62a. The transparent electrode material such as ITO and IZO is ohmically contacted with molybdenum or molybdenum alloy that is a material for forming the source/drain electrodes 58-1a, 58-2a so that the transparent electrode material is capable of uniformly transferring current impressed to the first electrode layer 63a from one of the source/drain electrodes 58-1a, 58-2a, preferably from the drain electrode 58-2a during driving of a display device.

According to preferred experimental examples of the present invention, it could be confirmed that contact resistance of a display device according to the present invention showed similar numerical values irrespective of position while contact resistance of the prior art showed that resistance numerical values are widely distributed when measuring contact resistance between drain electrode (MoW) and first electrode layer (ITO, ITO/AlNd) according to the present invention and the prior art. Consequently, direct contact between one of the source/drain electrodes 58-1a, 58-2a and the first electrode layer 62a that is a transparent electrode layer suggested in the present invention is performed as an ohmic contact and involved in luminance between the respective pixels.

Continuously, an opening part (not illustrated on drawing) for exposing a certain region of the first electrode layer 63a is formed by patterning the planarization insulation layer after forming a planarization insulation layer 64a on the first electrode layer 63a along the front surface of the substrate 50a.

Next, an organic layer 65a comprising at least one or more of emitting layers is formed on the first electrode layer 63a. The emitting layers are layers that self-emit lights of specific wavelength according to a recombination theory of electrons and holes injected from the cathode and the anode of an organic electroluminescence device, wherein the emitting layers emit red, green and blue lights themselves by flow of current, and the emitted lights are emitted to an upper side by being reflected the reflection layer 60a positioned under the first electrode layer 63a.

The emitting layers of the organic layer 65a are used with hole injection layer (HIL), hole transport layer (HTL), hole blocking layer (HBL), electron transport layer (ETL) and electron injection layer (EIL) having charge transporting capability being selectively and additionally inserted between respective electrodes and emitting layers to obtain high emission efficiency. In a top-emission type organic electroluminescence display device according to the present invention, second electrode layer 66a is acts as a cathode electrode if the first electrode layer 63a acts as an anode electrode, wherein the hole injection layer and hole transport layer added to the organic layer 65a are preferably positioned between the first electrode layer 63a and the emitting layers, and the hole blocking layer, electron transport layer and electron injection layer added to the organic layer 65a are preferably positioned between the emitting layers and second electrode layer 66a. The organic layer 65a comprising the emitting layers is formed by a wet type coating method including spin coating, dip coating, spray, screen printing and inkjet printing in which the organic layer 65a is coated in the solution state or a dry type coating method including sputtering, vacuum deposition and laser induced thermal imaging.

Subsequently, depositing a metallic substance on the substrate 50a forms second electrode layer 66a. The second electrode layer 66a is preferably formed of a transparent electrode layer so that light emitted by the organic layer 65a under the second electrode layer 66a and an external light are projected into the second electrode layer 66a, the second electrode layer 66a is formed by using a metal selected from the group consisting of a transparent electrode material such as ITO or IZO, or Mg, Ca, Al, Ag, Ba and alloy thereof ordinarily used, and the second electrode layer 66a is formed to such a thickness that light transmits the second electrode layer 66a.

A top-emission type organic electroluminescence display device in which thin film transistor, reflection layer 60a, first electrode layer 63a, organic layer 65a and second electrode layer 66a are sequentially laid up on the substrate 50a through the foregoing processes is finally sealed by an ordinary sealing means, wherein the sealing means is sealed by an insulation substrate formed of metal can and barium oxide or encapsulating the sealing means using insulation polymer.

Furthermore, a top-emission type organic electroluminescence display device according to the present invention further comprises a reflection layer between the second passivation layer and the first electrode layer to increase reflection efficiency.

Figure 5:
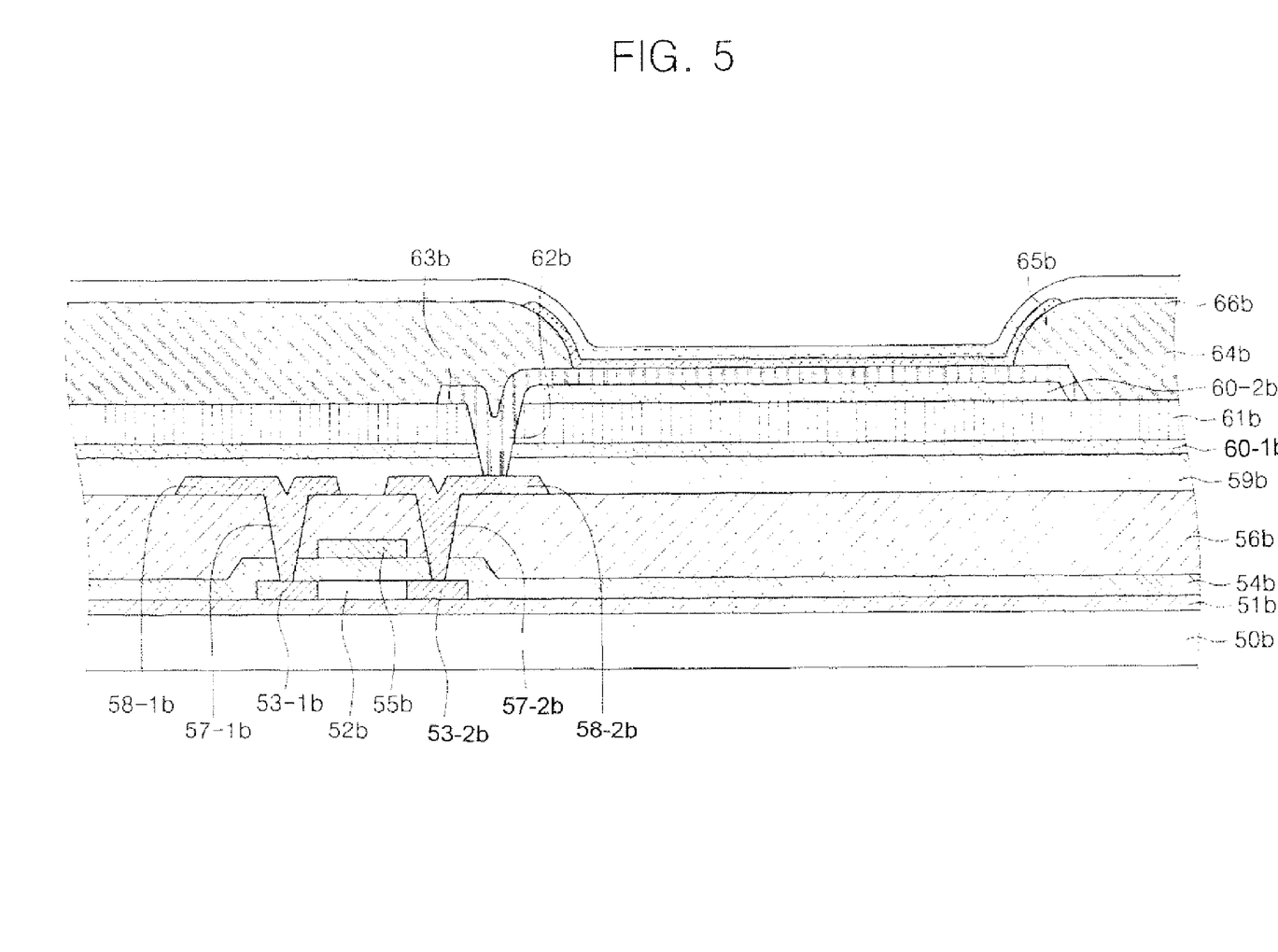
FIG. 5 is a cross sectional view of an organic electroluminescence display device taken along II-II' of FIG. 3 according to second preferred embodiment of the present invention.

FIG. 5 is a cross sectional view of a top-emission type organic electroluminescence display device comprising driving thin film transistor $T_D$ and organic electroluminescence device P taken along line II-II' of FIG. 3 according to second preferred embodiment of the present invention. An organic electroluminescence display device according to second preferred embodiment of the present invention is constructed in such a structure that the reflection layer is formed between the first and second passivation layers as well as between the second passivation layer and the first electrode layer to increase reflection efficiency differently from an organic electroluminescence display device according to first preferred embodiment of the present invention, wherein one of source/drain electrodes is directly contacted through contact hole.

Referring to FIG. 5, buffer layer 51b, semiconductor layer 52b equipped with source/drain regions 53-1b, 53-2b, gate insulation layer 54b, gate electrode 55b, interlayer insulation layer 56b and source/drain electrodes 58-1b, 58-2b are formed on substrate 50b by processes as mentioned above.

Subsequently, first reflection layer 60-1b is formed by depositing a reflecting metal on an upper part of the inorganic insulation layer after forming an inorganic insulation layer as an inorganic insulation layer on the source/drain electrodes 58-1b, 58-2b on the substrate 50b.

Next, a contact hole (not illustrated on drawing) for exposing one of the source/drain electrodes 58-1b, 58-2b under the first reflection layer to the outside is formed by etching a certain region of the first reflection layer 60-1b.

Continuously, second reflection layer 60-2b is formed by depositing a reflecting metal on an upper part of the organic planarization layer after forming an organic planarization layer as second passivation layer 61b by laying up an organic insulation material on the contact hole on the substrate 50b, wherein a metallic substance composing the second reflection layer 60-2b is the same as or different from a metallic substance composing first reflection layer 60-1b.

Consequently, a contact hole 62b coupled with the first contacted hole is formed by etching a certain region of the second reflection layer 60-2b. As a result of that, one of the source/drain electrodes 58-1b, 58-2b is exposed to the outside of the second passivation layer 61b through the contact hole 62b, and second reflection layer 60-2b is formed on an organic planarization layer 61b except a region of the contact hole 62b, preferably on an emission region. The formed first and second reflection layers 60-1b and 60-2b are not contacted with the source/drain electrodes 58-1b, 58-2b differently from a reflection electrode conventionally used to embody top emission and electrically coupled with source electrode or drain electrode 18-1, 18-2 of FIG. 2.

First electrode layer 63b is formed by patterning the deposited transparent electrode material after depositing a transparent electrode material on the second reflection layer 60-2b and the contact hole 62b on the substrate 50b. The transparent electrode material composing the first electrode layer 63b is formed with being included even in an edge part of the second reflection layer 60-2b as the transparent electrode material has excellent coverage. Consequently, the transparent electrode material is capable of suppressing erosion phenomena of the edge of the second reflection layer 60-2b formed of metal layer by strong acid or strong base used in the etching process when forming a planarization insulation layer 64b in the succeeding process.

A top-emission type organic electroluminescence display device is completed through the sealing process after forming the planarization insulation layer 64b on the substrate 50b as described in the above, forming an opening part by patterning a certain region of the planarization insulation layer 64b, thereby exposing a part of the first electrode layer 63b to the outside, forming an organic layer 65b comprising at least one or more of emitting layers on the first electrode layer 63b, forming second electrode layer 66b on the substrate 50b, and then passing through the sealing process, wherein details such as material and fabrication method of the source/drain electrodes 58-1b, 58-2b, first and second reflection layers 60-1b, 60-2b, first electrode layer 63b, organic layer 65b and second electrode layer 66b are the same as in the foregoing first preferred embodiment of the present invention.

When driving top-emission type organic electroluminescence display devices of first and second preferred embodiments of the present invention obtained through the foregoing processes, light emitted from the emitting layer is emitted to the outside through the second electrode layer, and light is reflected by the reflection layer under the first electrode layer so that the reflected light is emitted to the outside through the second electrode layer, wherein luminance of the display device can be increased since the reflection layer formed on the substrate including a non-emission region is capable of reflecting light lost to the rear side of the substrate as suggested in the present invention.

Furthermore, reflection characteristics of the display device due to non-uniformity of contact resistance between conventional reflection layer and transparent electrode layer is improved by directly electrically contacting drain electrode of thin film transistor with first electrode layer, thereby obtaining stable contact resistance.

Consequently, a top-emission type organic electroluminescence display device according to the present invention not only improves luminance by increasing intensity of light emitted to the outside, but also realizes screen of high quality by displaying uniformed luminance between pixels.

A top-emission type organic electroluminescence display device having a structure in which first electrode layer is directly coupled with any one of source/drain electrodes of thin film transistor, and reflection layer is not coupled with the source/drain electrodes is suggested in the first and second preferred embodiments of the present invention, wherein the thin film transistor further comprises various layers, for example, insulation layer according to purposes, and selection of the layers can be properly done by a person having ordinary knowledge on the related field. Furthermore, a top-emission type organic electroluminescence display device of the present invention can be preferably applied to a bottom-gate structured thin film transistor in addition to the foregoing top-gate structured thin film transistor.

The organic electroluminescence display device is capable of embodying single color or full colors according to components of organic layer, embodying high reflectivity for any color and embodying display of high luminance since there are not color running or light reduction even though light emitted from emitting layer is projected to second electrode layer through reflection layer.

An organic electroluminescence display device according to the present invention is described through the following experimental example, and the following experimental example is just an exemplification for explaining the present invention, but the present invention is not limited to the following experimental example.

EXPERIMENTAL EXAMPLE

An inorganic insulation layer of SiNx as first passivation layer was formed on an upper part of the source/drain electrodes after forming a thin film transistor comprising semiconductor layer, gate electrode and source/drain electrodes through a certain semiconductor process in order to fabricate a top-emission type organic electroluminescence display device according to the present invention, wherein the source/drain electrodes was formed by sputtering molybdenum-tungsten alloy.

Subsequently, a contact hole for exposing the drain electrode under the first passivation layer to the outside was formed by etching a certain region of the first passivation layer after forming a reflection layer by sputtering Al—Nd alloy on an upper part of the first passivation layer over the front surface of a substrate.

Next, the drain electrode under the second passivation layer was exposed to the outside by etching the same certain region as the contact hole of the previous process after forming an organic planarization film that is second passivation layer by laying up BCB that is an organic insulation material on the contact hole on the substrate.

Continuously, first electrode layer was formed by performing the dry type etching process after carrying out the photolithography process comprising exposing and developing processes after coating acryl based photoresist on an upper part of the transparent electrode layer after depositing ITO on the contact hole on the substrate.

An opening part was formed in the insulation layer by performing the foregoing photolithography process in the same manner, thereby patterning the insulation layer after forming an insulation layer (pixel defining layer) on the first electrode layer.

An emitting layer having thickness of 350 Å was formed by vacuum depositing CBP+GD33 on the hole transport layer, an electron transport layer having thickness of 350 Å was formed by vacuum depositing 019ETL on the emitting layer, and an electron injection layer having thickness of 3 Å was formed by vacuum depositing LiF on the electron transport layer after forming a hole transport layer having thickness of 600 Å by vacuum depositing IDE320 on the first electrode layer on the substrate.

An organic electroluminescence display device was fabricated by sealing the second electrode layer using a metal can after forming second electrode layer having thickness of 1,100 Å by vacuum depositing MgAg and ITO on the electron injection layer.

COMPARATIVE EXAMPLE

A top-emission type organic electroluminescence display device in which one of source/drain electrodes of thin film transistor was directly contacted with reflection layer was fabricated by the prior art.

The top-emission type organic electroluminescence display device was fabricated in the same manner as in the experimental example except that the reflection layer was not formed between double passivation layers, but formed under transparent electrode layer of first electrode layer.

TEST EXAMPLE

Figure 6A:
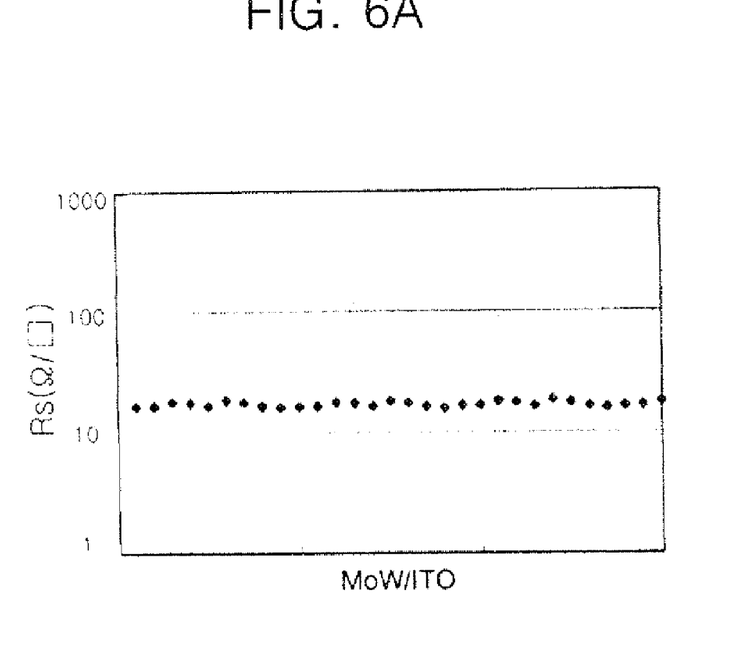
FIG. 6a is a graph for showing that contact resistance in first electrode layer is stabilized in experimental example according to the present invention.
Figure 7A:
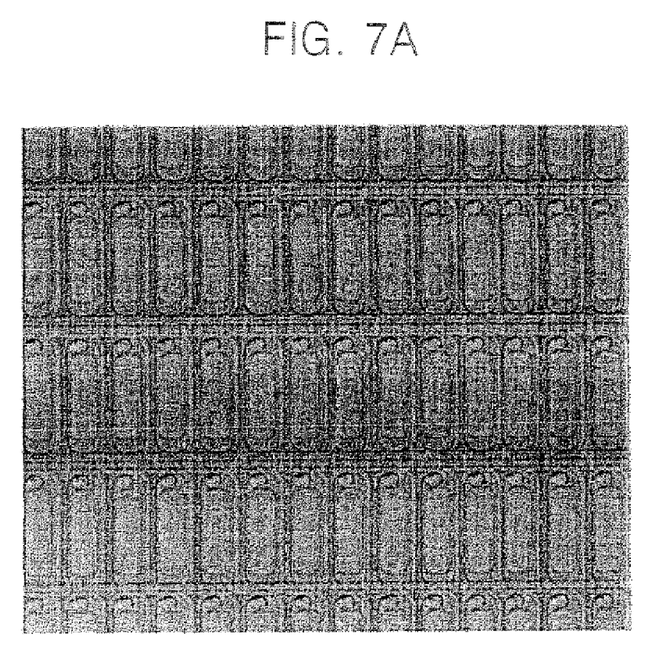
FIG. 7a is a photograph showing that luminance between pixels of a top-emission type organic electroluminescence display device obtained in experimental example according to the present invention is uniform.
Figure 7B:
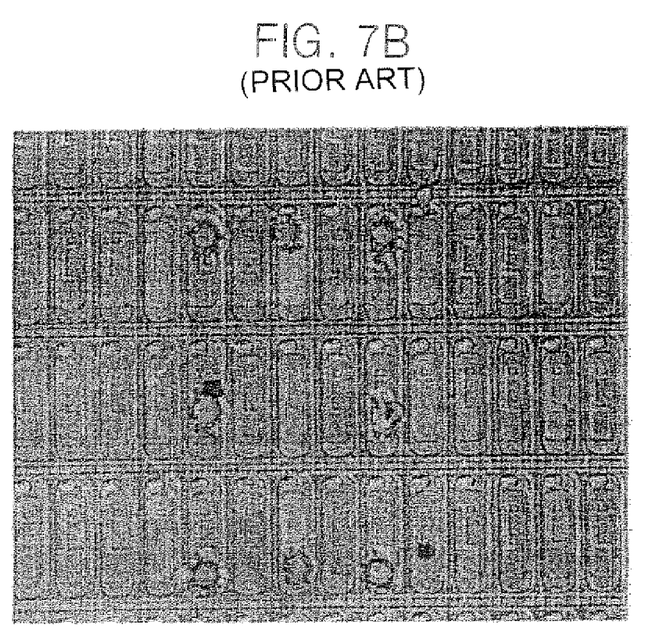
FIG. 7b is a photograph showing that luminance between pixels of a top-emission type organic electroluminescence display device obtained in comparative example according to prior art is uneven.

Contact resistance values of the drain electrode and first electrode layer of the organic electroluminescence display device obtained in the foregoing experimental example and comparative example and the surface state of the display device were measured by microscope, and the measurement results were displayed in FIG. 6a and FIG. 7b.

A: Contact Resistance

Figure 6B:
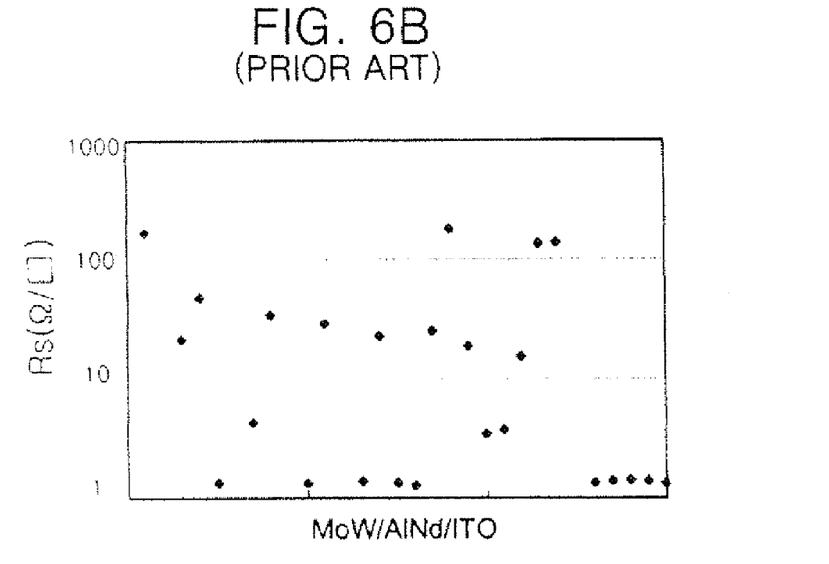
FIG. 6b is a graph for showing instability of contact resistance in first electrode layer in comparative example according to prior art.

FIG. 6a is a graph for measuring contact resistance on interface of drain electrode/transparent electrode layer (MoW/ITO) of the top-emission type organic electroluminescence display device obtained in the foregoing experimental example according to the present invention, and FIG. 6b is a graph for measuring contact resistance on interface of drain electrode/reflection layer/transparent electrode layer (MoW/AlNd/ITO) of the top-emission type organic electroluminescence display device obtained in the foregoing comparative example.

Referring to FIG. 6a, it can be seen that contact resistance values measured on an arbitrary region of the first electrode layer are almost constant. As a result of that, it can be seen that the drain electrode is ohmically contacted with the first electrode layer since contact resistance between drain electrode formed of MoW and first electrode layer formed of ITO is very stabilized. FIG. 6b shows a tendency that contact resistance values between first electrode layer formed of Al—Nd/ITO and drain electrode formed of MoW are distributed in the wide range since contact resistance between the electrodes is very instable, and Al2O3 oxide film is formed on interface of Al—Nd used as reflection layer and ITO according to galvanic effect.

The contact resistance of FIG. 6a and FIG. 6b has a direct effect on luminance of an organic electroluminescence display device, and that can be seen in the following FIG. 7a and FIG. 7b.

B: Surface State

FIG. 7a is a photograph showing the surface state at pixels of a top-emission type organic electroluminescence display device obtained in the experimental example, and FIG. 7b is a photograph showing the surface state at pixels of a top-emission type organic electroluminescence display device obtained in the comparative example.

Referring to FIG. 7a, it can be seen that reflection efficiency is excellent even if reflection layer is positioned between double passivation layers on the substrate in a top-emission type organic electroluminescence display device according to the experimental example of the present invention, wherein a reflection layer formed on an upper part of the first passivation layer is formed in a bent shape by adopting an inorganic insulation layer as first passivation layer so that reflection efficiency is increased due to focusing phenomena of EL light projected by the bent reflection layer accordingly, and the EL light lost to the rear side is also minimized as the reflection layer is being formed on the substrate.

Furthermore, it can be confirmed by the naked eye that the respective pixels display the almost uniform luminance, and it can be seen that the display device has very good reflection characteristics since the drain electrode is ohmically contacted with the first electrode layer as it can be known in the previous contact resistance measuring test.

Referring to FIG. 7b, it can be seen that non-uniformity of luminance between respective pixels is very severe since some of the pixels are displayed dark while other some of the pixels are displayed bright in case of using a reflection electrode having two layers of reflection layer and transparent electrode. Furthermore, it can be seen that surface characteristics are defective as defects such as mura are formed on the surface of the display device, and reflection efficiency of the display device is also low.

Resultingly, consumption of power required for driving the display device is reduced accordingly by directly contacting one of the source/drain electrodes of thin film transistor with first electrode layer that is a transparent electrode layer according to the present invention, thereby solving problems such as non-uniformity of luminance between pixels as shown in FIG. 7b and improving reflection characteristics.

As described in the above, a top-emission type organic electroluminescence display device in which any one of the source/drain electrodes of thin film transistor was directly contacted with a transparent electrode layer that is first electrode layer, and a reflection layer for embodying top-emission was formed between double passivation layers on the substrate was fabricated by the present invention.

A top-emission type organic electroluminescence display device according to the present invention improves instability of contact resistance on interface between source or drain electrode and reflection electrode generated by adopting a conventional reflection electrode by directly contacting any one of source/drain electrodes for displaying uniform contact resistance with transparent electrode layer.

Furthermore, a top-emission type organic electroluminescence display device according to the present invention increases reflection characteristics of the display device by positioning reflection layer for embodying top-emission between double passivation layers on the substrate so that the reflection layer is capable of reflecting EL light lost to the rear side.

Resultingly, luminance between respective pixels of a top-emission type organic electroluminescence device obtained by the present invention is uniform so that a top-emission type organic electroluminescence display device capable of embodying screen of high quality can be fabricated.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An organic electroluminescence display device, comprising:
   double passivation layers arranged on an upper portion of a thin film transistor, wherein the thin film transistor comprises a semiconductor layer, a gate electrode and source/drain electrodes on a substrate;
   a reflection layer arranged between the double passivation layers and arranged on the substrate;
   a first electrode layer arranged on the double passivation layers, wherein the first electrode layer is electrically coupled with at least one of the source/drain electrodes;
   an organic layer comprising at least one emitting layer arranged on the first electrode layer; and
   a second electrode layer arranged on the substrate,
   wherein the source/drain electrodes are arranged between the double passivation layers and the gate electrode.

2. The organic electroluminescence display device of claim 1, further comprising a reflection layer arranged between the double passivation layers and the first electrode layer.

3. The organic electroluminescence display device of claim 1, wherein the source/drain electrodes comprise at least one of molybdenum (Mo) and molybdenum-tungsten alloy (MoW).

4. The organic electroluminescence display device of claim 1, wherein the double passivation layers include an inorganic insulation layer and an organic planarization layer.

5. The organic electroluminescence display device of claim 4, wherein the inorganic insulation layer comprises at least one of silicon nitride film and silicon oxide film.

6. The organic electroluminescence display device of claim 4, wherein the organic planarization layer is selected from the group consisting of polyacrylates resin, epoxy resin, phenolic resin, polyamides resin, polyimides resin, unsaturated polyesters resin, poly(phenyleneethers) resin, poly(phenylenesulfides) resin and benzocyclobutene (BCB).

7. The organic electroluminescence display device of claim 1, wherein the reflection layer comprises one metallic substance selected from the group consisting of silver (Ag), aluminum (Al), chromium (Cr), molybdenum (Mo), tungsten (W), titanium (Ti), tantalum (Ta) and aluminum-neodymium (Al—Nd) alloy.

8. The organic electroluminescence display device of claim 1, wherein the first electrode layer comprises a transparent electrode material selected from the group consisting of indium tin oxide (ITO) and indium zinc oxide (IZO).

9. The organic electroluminescence display device of claim 1, wherein the organic layer further comprises at least one layer selected from the group consisting of a hole injection layer, a hole transport layer, a hole blocking layer, an electron transport layer and an electron injection layer capable of transporting an electric charge.

10. The organic electroluminescence display device of claim 1, wherein the second electrode layer is formed of a metal selected from the group consisting of ITO, IZO, Mg, Ca, Al, Ag, Ba and an alloy thereof.

11. The organic electroluminescence display device of claim 1, wherein any one of the first electrode layer and the second electrode layer is an anode electrode.

12. A method for fabricating an organic electroluminescence display device comprising the steps of:
   forming a thin film transistor, wherein the thin film transistor comprises a semiconductor layer, a gate electrode and source/drain electrodes on a substrate in a non-emitting region;
   forming a first passivation layer on the source/drain electrodes on the substrate;
   forming a reflection layer on the first passivation layer over the front surface of the substrate;
   forming contact holes for exposing one of the source/drain electrodes to the outside by etching a selected region of the reflection layer;
   forming a second passivation layer on the reflection layer over the front side of the substrate;
   exposing one of the source/drain electrodes to the outside by etching a selected region of the second passivation layer so that the second passivation layer is coupled with the contact holes;
   forming a first electrode layer coupled with one of the source/drain electrodes by patterning a transparent electrode material after depositing the transparent electrode material over the front surface of the substrate;
   forming an organic layer comprising at least one emitting layer on the first electrode layer; and
   forming an organic electroluminescence device by forming a second electrode layer on the substrate.

13. The method for fabricating an organic electroluminescence display device of claim 12, wherein the method further comprises a step of forming a reflection layer between the contact hole forming step and the first electrode layer forming step.

14. The method for fabricating an organic electroluminescence display device of claim 12, wherein any one of the first passivation layer and the second passivation layer is an inorganic insulation layer.

15. The method for fabricating an organic electroluminescence display device of claim 12, wherein any one of the first passivation layer and the second passivation layer is an organic planarization layer.

* * * * *